(12) United States Patent  (10) Patent No.: US 8,928,638 B2
Arai  (45) Date of Patent: Jan. 6, 2015

(54) DISPLAY DEVICE

(75) Inventor: Toshiaki Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 575 days.

(21) Appl. No.: 11/458,873

(22) Filed: Jul. 20, 2006

(65) Prior Publication Data

US 2007/0024787 A1 Feb. 1, 2007

(30) Foreign Application Priority Data

Jul. 27, 2005 (JP) .................................. 2005-217819

(51) Int. Cl.
*G06F 3/038* (2013.01)
*H01L 27/12* (2006.01)

(52) U.S. Cl.
CPC ........ *H01L 27/1285* (2013.01); *H01L 27/1296* (2013.01)
USPC .............................................. 345/204; 257/72

(58) Field of Classification Search
CPC .................................................. H01L 27/1214
USPC ....................................................... 345/204
See application file for complete search history.

(56) References Cited

U.S. PATENT DOCUMENTS 5,294,811 A * 3/1994 Aoyama et al. ................. 257/59
6,774,574 B1 * 8/2004 Koyama ..................... 315/169.3
2002/0057266 A1 * 5/2002 Miyajima ..................... 345/204
2003/0227584 A1 * 12/2003 Onozuka et al. ................. 349/61
2004/0134878 A1 * 7/2004 Matsushita et al. ............. 216/23
2005/0116905 A1 * 6/2005 Kim et al. ........................ 345/76
2005/0148119 A1 * 7/2005 Fujimura ..................... 438/141

FOREIGN PATENT DOCUMENTS

| JP | 07-302907 | 11/1995 |
|---|---|---|
| JP | 10-197896 | 7/1998 |
| JP | 2001-250790 | 9/2001 |
| JP | 2002-299051 | 10/2002 |
| JP | 2005-165325 | 6/2005 |
| JP | 2005-191564 | 7/2005 |

OTHER PUBLICATIONS

Japanese Office Action for corresponding JP2005-217819 issued on Aug. 31, 2010.

* cited by examiner

*Primary Examiner* — Hsin-Yi Hsieh (74) *Attorney, Agent, or Firm* — K&L Gates LLP (57) ABSTRACT

A display device and method for manufacturing same are provided. The display device including a plurality of unit pixels disposed in the matrix on a substrate, each of the unit pixels has a thin film transistor at a place other than the center of the pixel, and unit pixels in a first row and unit pixels in a second row adjacent to the first row are arranged so that they are symmetric with respect to a first virtual plane orthogonal to a main surface of the substrate.

8 Claims, 10 Drawing Sheets

PRIOR ART

FIG. 10 PRIOR ART

DISPLAY DEVICE

CROSS REFERENCES TO RELATED APPLICATIONS

The present application claims priority to Japanese Patent Application JP 2005-217819 filed in the Japanese Patent Office on Jul. 27, 2005, the entire contents of which is incorporated herein by reference.

BACKGROUND

The present invention relates to a display device provided with a plurality of unit pixels driven by thin film transistors and a method for manufacturing the display device.

In recent years, flat panel display type display devices based on an active matrix system provided with driving elements including film transistors (TFTs) have been noted. Most of all, a display device taking the advantage of organic electro luminescence (EL) has been developed toward commercialization.

Figure 7:
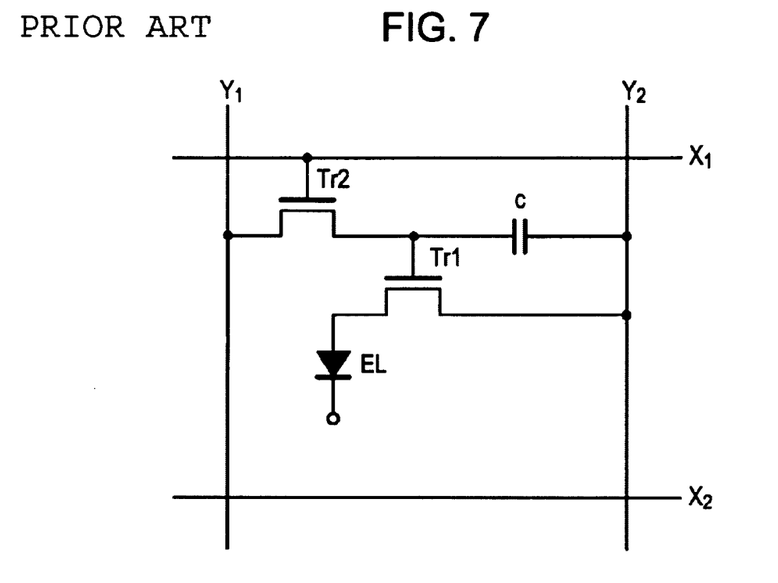
FIG. 7 is an equivalent circuit diagram for explaining driving of a unit pixel constituting a display device.

Here, the principle of light emission of a unit pixel of an organic EL display device based on the active matrix system will be described with reference to an equivalent circuit of the unit pixel shown in FIG. 7. A signal line is represented by Y1, a current supply line is represented by Y2, and scanning lines are represented by X1 and X2.

A voltage is always supplied to the current supply line Y2. When a scanning pulse is applied to the scanning line X1 and a predetermined signal is supplied to the signal line Y1, a second transistor Tr2 is turned on, and a predetermined signal is written into a storage capacitor C. A first TFT transistor Tr1 is turned on based on the written signal, a current in accordance with the amount of signal is supplied through the current supply line Y2 to a light emitting portion EL and, thereby, the light emitting portion EL emits light.

A plurality of the unit pixels are arranged in the matrix, so that a display device is configured.

Figure 8:
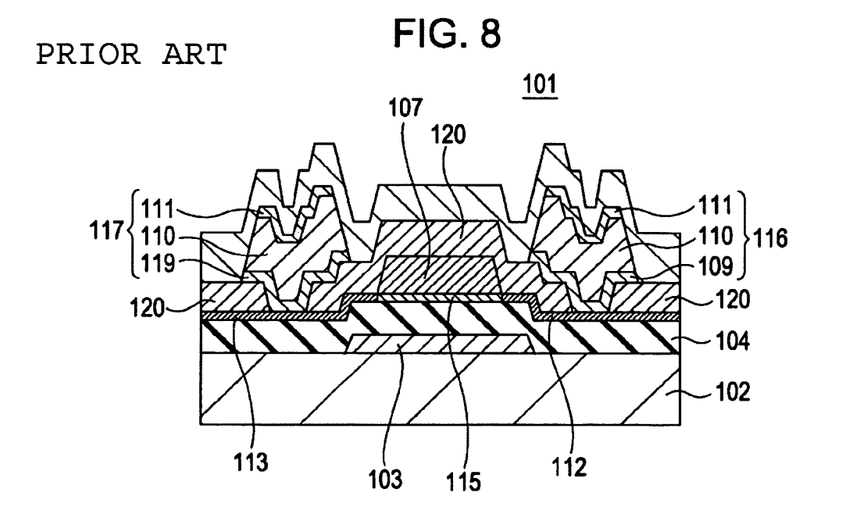
FIG. 8 is a schematic sectional diagram of a thin film transistor constituting a display device in the past.

The configuration of each thin film transistor will be described below. FIG. 8 shows a bottom gate type known thin film transistor 101 having a channel region made of p-Si.

In the thin film transistor 101, a gate electrode 103 is disposed on a molybdenum thin film on a substrate 102. a gate insulating layer 104 made of SiN and $SiO_2$ and a crystalline Si layer 105 are disposed over the gate electrode 103 and the periphery thereof.

The crystalline Si layer 105 is provided by irradiating an amorphous silicon (α-Si) layer with a laser like an excimer laser.

Figure 9A:
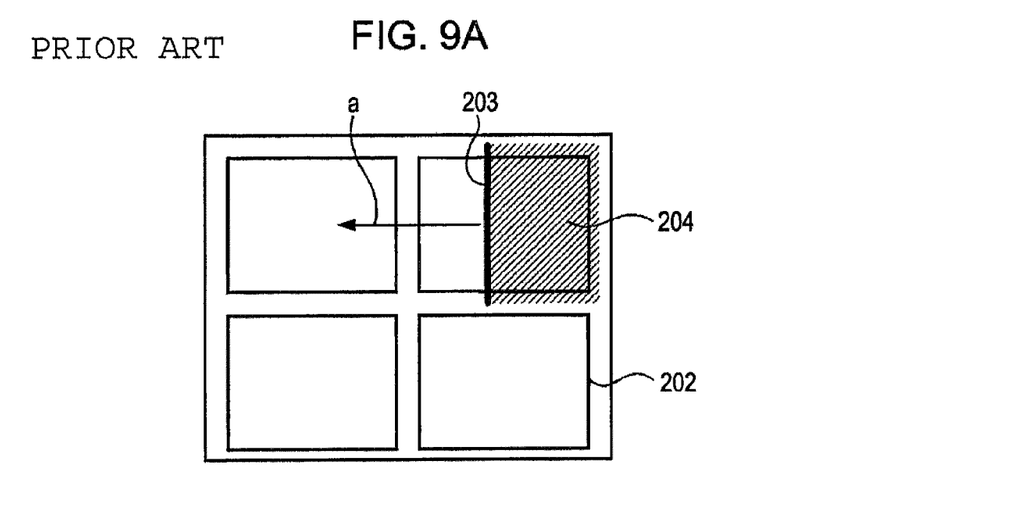
FIG. 9A is a schematic diagram for explaining an example of laser annealing.

In the case where crystallization is effected with the excimer laser or the like, as shown in FIG. 9A, pulsed laser light 203 shaped to have substantially the same width as the width of a unit region 202 including a thin film transistor formation portion is stepped sequentially in a direction perpendicular to a major axis direction (width direction) of the laser light 203, and is continuously applied to amorphous silicon. In FIG. 9A, reference numeral 204 denotes a laser irradiation region.

Figure 9B:
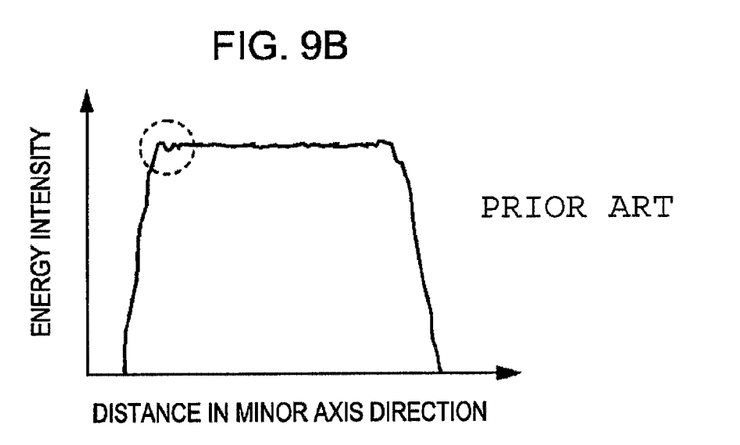
FIG. 9B is a schematic diagram showing an example of energy intensity of the laser light.

However, the pulsed laser light 203 has energy variations of about 5% on a pulse basis. Furthermore, the laser light 203 also has an energy distribution in a minor axis direction (movement direction a). Therefore, as shown in FIG. 9B, an intense energy point (indicated by a broken line in the drawing) may occur at an energy irradiation end.

In the case where laser light exhibiting nonuniformity due to variations among pulses or in a pulse, as described above, is applied, in order to leveling the irradiation energy in the unit region 202 to be irradiated, for example, a step movement between infinitesimal sections in the minor axis direction and laser irradiation are repeated. Furthermore, 90% to 95% of regions of the individual pulses are allowed to overlap one another and, thereby, the difference in cumulative irradiation energy in a unit region 202 is reduced.

Figure 10:
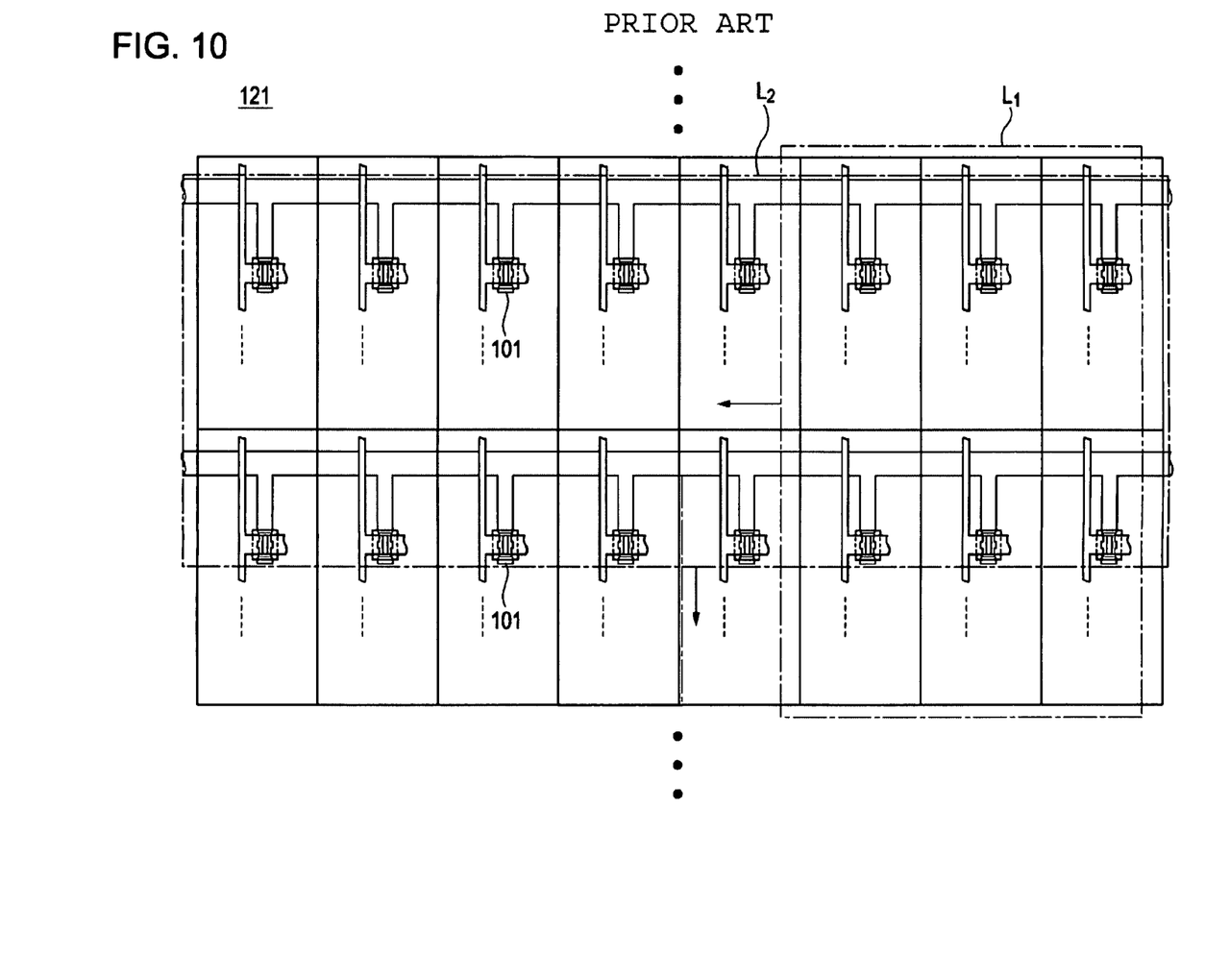
FIG. 10 is a schematic diagram showing the configuration of a display device in the past.

However, the crystallinity of individual unit pixels may not be satisfactorily leveled by such a technique, and luminance variations are recognized during the operation of a display device 121 (refer to FIG. 10).

For the purpose of leveling characteristic variations among TFT elements in a current mirror or a differential circuit, Japanese Unexamined Patent Application Publication No. 10-197896, for example, proposes that TFT elements in the circuit are arranged to become symmetric with respect to a point, the TFT elements located at the positions symmetric with respect to the point are connected in series, individual characteristic variations which inevitably occur within a certain range are leveled and, as a result, the characteristics of nearby two pairs of TFT series circuits are leveled.

However, according to the technique disclosed in Japanese Unexamined Patent Application Publication No. 10-197896, since there is a need for connecting the thin film transistors in series, the configuration of the driving element becomes complicated, and the yield is decreased. In addition, when the laser is applied with the step movement, as described above, the gate wiring is also be irradiated with the laser light. For example, in the case where the gate wiring is made of a material, such as aluminum, having low thermal resistance, the heat due to the laser irradiation is conducted to the gate wiring and, therefore, abnormal crystal growth, e.g., hillock or whisker, is allowed to proceed, and short-circuiting results. Therefore, there is a limit of material to be used as the gate wiring.

SUMMARY

The present invention addresses the above identified, and other problems. It is desirable to provide a display device, in which characteristic variations of TFT are reduced and the yield reduction is suppressed, and a method for manufacturing the dispersion device.

A display device according to an embodiment of the present invention includes a plurality of unit pixels provided with thin film transistors and disposed in the matrix on a substrate, wherein unit pixels in a first row and unit pixels in a second row adjacent to the first row are arranged so that they are symmetric with respect to a first virtual plane orthogonal to a main surface of the above-described substrate.

A method for manufacturing a display device including a plurality of unit pixels provided with thin film transistors and disposed in the matrix on a substrate, according to an embodiment of the present invention, includes the steps of arranging unit pixels in a first row and unit pixels in a second row adjacent to the first row so that they are symmetric with respect to a first virtual plane orthogonal to a main surface of the above-described substrate and crystallizing silicon constituting at least a part of the above-described thin film transistors by irradiating simultaneously the unit pixels in the above-described first row and the unit pixels in the above-described second row with laser light.

In the display device according to an embodiment of the present invention, a plurality of unit pixels provided with thin film transistors are disposed in the matrix on the substrate, and the unit pixels in the first row and the unit pixels in the second row adjacent to the first row are arranged so that they are symmetric with respect to the first virtual plane orthogonal to the main surface of the above-described substrate.

Therefore, silicon in the channel regions of unit pixels in the first row and the second row may be substantially equally crystallized. Consequently, driving elements including highly uniform thin film transistors may be formed.

In the method for manufacturing a display device according to an embodiment of the present invention, the unit pixels in the first row and the unit pixels in the second row adjacent to the first row are irradiated with the laser light having a uniform energy distribution. Consequently, the unit pixels in the first row and the unit pixels in the second row may be irradiated with the laser light having a uniform energy distribution. Furthermore, the unit pixels in adjacent two rows are subjected to simultaneous laser annealing, so that the process tact may be reduced by almost a half.

In the method for manufacturing a display device according to an embodiment of the present invention, even in the case where components, e.g., wirings, composed of a material, e.g., aluminum or silver, having low thermal resistance or a material, e.g., copper, having the diffusibility are disposed in advance, it is possible to irradiate a channel region simply with a laser region having uniform intensity, while the wiring portion is avoided from being irradiated.

Additional features and advantages are described herein, and will be apparent from, the following Detailed Description and the figures.

BRIEF DESCRIPTION OF THE FIGURES

Each of FIGS. 2A and 2B is a schematic diagram for explaining an example of a method for manufacturing a display device according to an embodiment of the present invention.

Each of FIGS. 5A to 5C is a step diagram for explaining an example of a method for manufacturing a display device according to an embodiment of the present invention.

Each of FIGS. 6A to 6C is a schematic sectional diagram in an example of a method for manufacturing a display device according to an embodiment of the present invention.

DETAILED DESCRIPTION

Embodiments according to the present invention will be described below with reference to drawings.

Display Device

A display device according to an embodiment of the present invention will be described.

Figure 1:
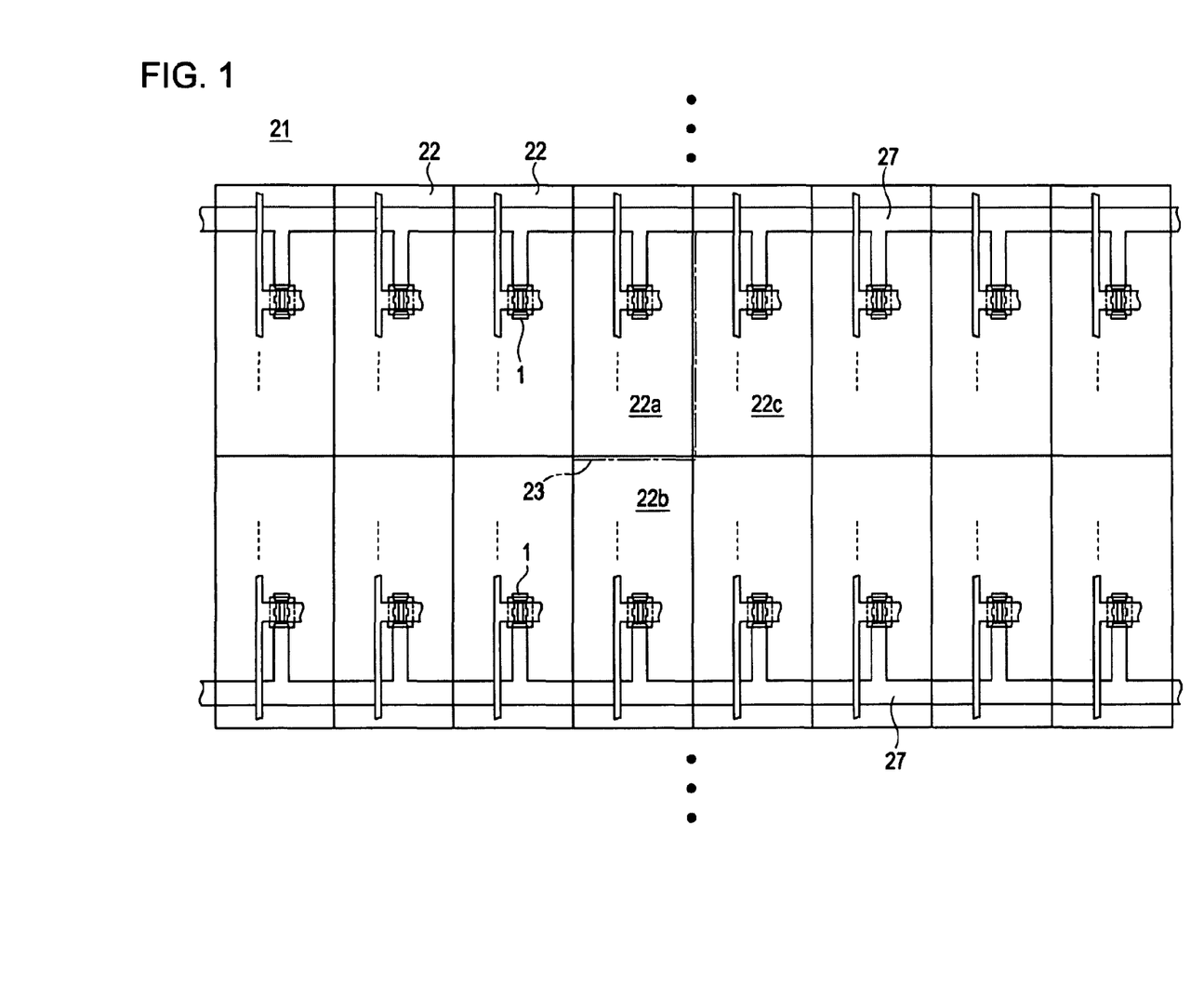
FIG. 1 is a schematic diagram showing the configuration of an example of a display device according to an embodiment of the present invention.

In a display device 21 according to the present embodiment, as shown in FIG. 1, a plurality of unit pixels 22 provided with thin film transistors are disposed in the matrix on a substrate, and the arrangements in a first unit pixel 22a and a second unit pixel 22b adjacent to each other are symmetric with respect to a first virtual plane 23 orthogonal to a main surface (that is, the drawing) of the above-described substrate.

In the present embodiment, among a plurality of thin film transistors constituting driving elements in the first unit pixel 22a and the second unit pixel 22b, for example, thin film transistors 1 serving as switching transistors are arranged to become symmetric with respect to the first virtual plane 23.

In the display device 21 according to the present embodiment, the laser irradiation to crystallize semiconductor layers of the thin film transistors may be conducted efficiently. That is, the unit pixels in two rows sandwiching the first virtual plane 23 may be crystallized by one operation.

When a 12-inch diagonal organic EL display was produced on the basis of a display device configuration according to the present embodiment, a tact time with respect to the laser irradiation was able to be reduced by almost a half as compared with that in the past, and it was also ascertained that highly uniform luminance was exhibited.

Method for Manufacturing Display Device

A method for manufacturing a display device according to an embodiment of the present invention will be described.

Figure 2A:
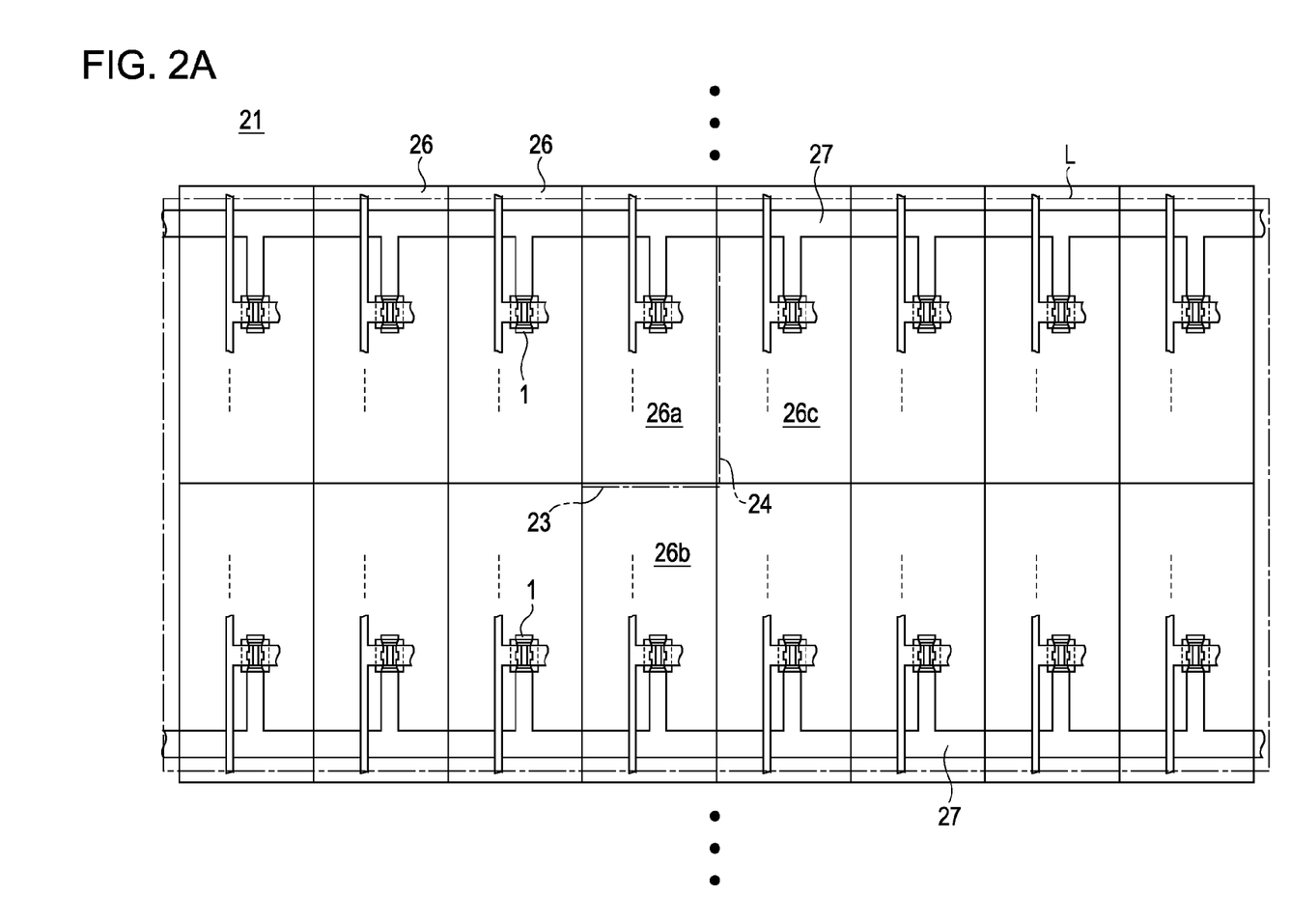

The method for manufacturing a dispersion device according to the present embodiment is a method for manufacturing a display device in which, as shown in FIG. 2A, a plurality of unit regions 26 corresponding to unit pixels 22 including a thin film transistor 1 and other plural thin film transistors (not shown in the drawing) are disposed in the matrix, and a first unit region 26a and a second unit region 26b adjacent to each other are arranged to become symmetric with respect to a first virtual plane 23 orthogonal to a main surface of the above-described substrate.

Here, the pulsed laser light L used for step irradiation has energy variations of about 5% on a pulse basis. In the present embodiment, the first unit region 26a and the second unit region 26b are simultaneously subjected to the step irradiation of the laser light L with an excimer laser. Therefore, the process tact may be reduced by almost a half.

In the present embodiment, the step irradiation of the laser light L is applied while pulsed laser light from an excimer laser is shaped into a line and the width in a minor axis direction is adjusted to become slightly smaller than two pixel lengths. In order to level the influence of energy variations among pulses, it is preferable that the irradiation is about 8 to 20 pulses per place, that is, per unit region.

In the case where the energy distribution in the minor axis direction is not always stable, it is preferable that the number of pixels included in the minor axis direction is specified to be 1 to 2 pixels from the viewpoint of reduction of variations among pixels. In addition, if necessary, at least a part, for example, a half, of the laser irradiation is conducted while a substrate constituting ultimately the display device 21 is rotated by 180 degrees and, thereby, the characteristics of the thin film transistors disposed at symmetric positions in the adjacent pixels may be further leveled.

In the case where a gate wiring 27, for example, is composed of a material having the low thermal resistance or a material having the diffusibility, deformation, denaturation, or diffusion of the metal may occur due to a thermal damage resulting from the laser irradiation.

Figure 2B:
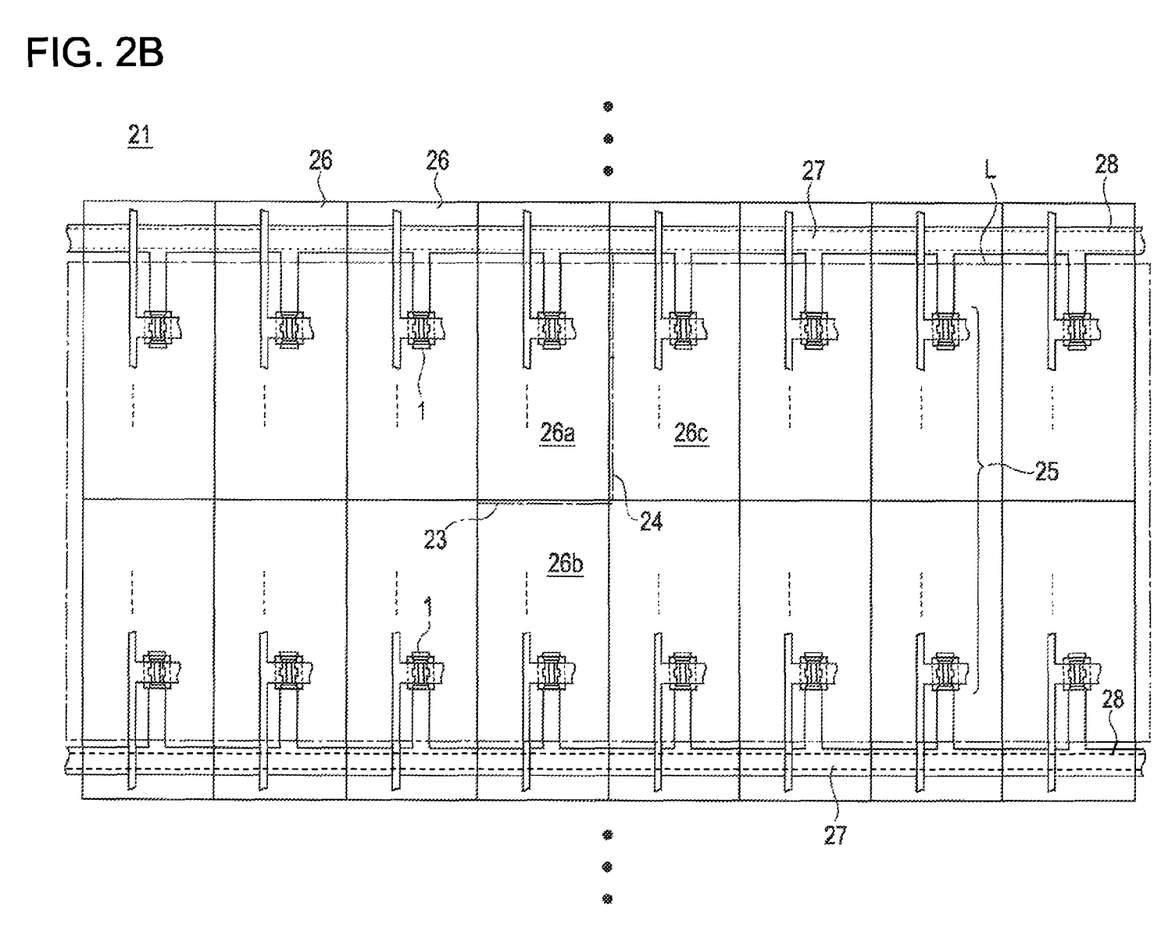

In order to address this, for example, in adjacent portions 25 adjacent to a first virtual plane 23, as shown in FIG. 2B, it is preferable that thin film transistors composed of a highly heat-resistant material are simply irradiated with the laser light and a low-resistance electrically conductive material electrically connected to thin film transistors composed of a low-resistance metallic material is not irradiated with the laser light. In this case, it is more preferable that gate electrodes and the like in the adjacent portions 25 are composed of a metal having the thermal resistance higher than the thermal resistance of the gate wiring 27.

The laser light to be applied may has the above-described energy distribution in a minor axis direction of the laser light, and an intense energy point may occur at a laser irradiation end. If the intense energy point is contained in a unit region, variations occur in the amount of energy applied and, thereby, individual differences occur with respect to characteristics in individual unit regions. However, in the present embodiment, it is possible to set the irradiation region in such a way as to selectively exclude the intense energy point from the unit region. Therefore, occurrences of individual differences and luminance variations of the display device 21 based thereon may be avoided.

That is, in the method for manufacturing a display device according to the present embodiment, the arrangement shape in the unit region 26 may be selected in such a way that a channel region of the transistor is not irradiated with a nonuniform portion of the laser energy. For a common excimer laser, it is preferable that about 8 to 20 pulses per place are applied in order to level the influence of energy variations among pulses. However, a slight movement within the range not allowing the channel region to include the intense energy portion at the irradiation end may be repeated in order to reduce the influence of the energy distribution in a pulse.

Figure 3:
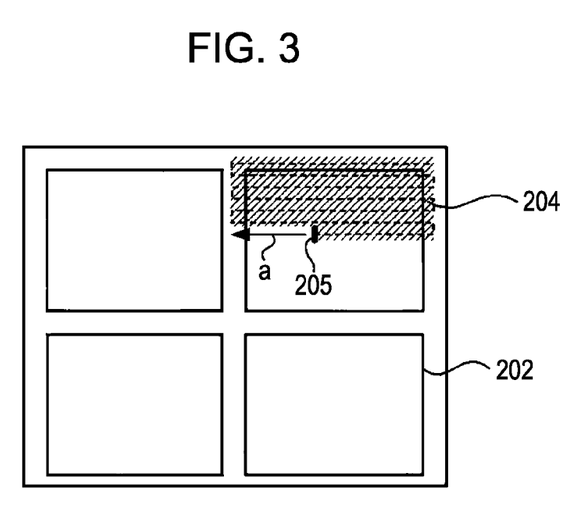
FIG. 3 is a schematic diagram for explaining a method for manufacturing a display device according to an embodiment of the present invention.

FIG. 3 is a schematic diagram showing an example in which scanning irradiation of the laser light is conducted with a solid laser. In general, since the output of the solid laser is lower than the output of the excimer laser, in many cases, the width on the order of a few hundred micrometers in a major axis direction is simply ensured to supply energy required for crystallizing a thin film transistor, for example. Therefore, for the laser irradiation, as shown in FIG. 3, it is preferable that scanning in the minor axis direction is conducted on a row-by-row basis, sliding in the major axis direction is repeated after each scanning is finished and, thereby, crystallization is conducted on a line-by-line basis.

This is because few solid lasers are capable of outputting high energy required for crystallization at wavelengths suitable for being absorbed by amorphous silicon serving as a precursor to constitute the channel region of the thin film transistor. In particular, for a middle or large display, it is difficult to ensure one pixel length as the major axis width.

One pixel may also be annealed by a plurality of scanning irradiation. In that case as well, it is desirable that the above-described nonuniform irradiation end of the laser energy is not applied to the channel portion of the thin film transistors 1 required to have uniform transistor characteristics.

Figure 4:
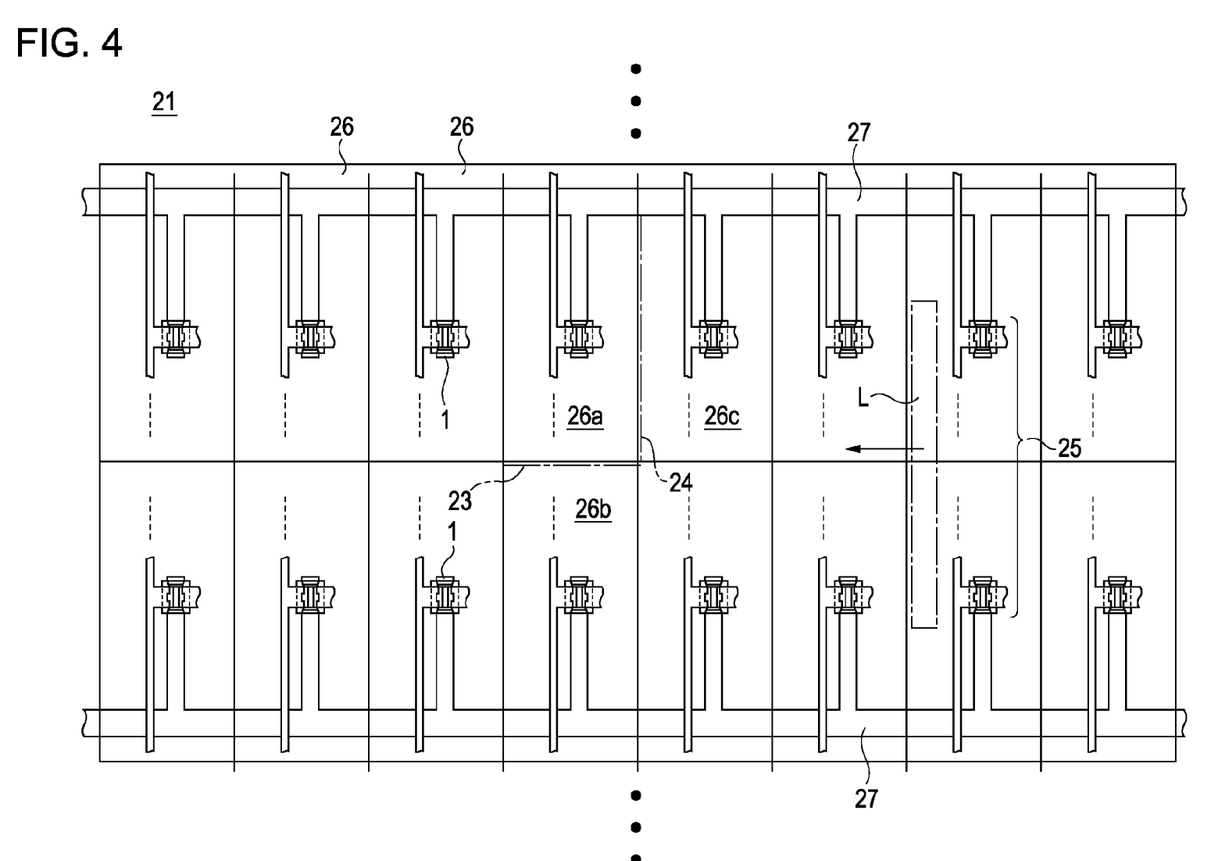
FIG. 4 is a schematic diagram for explaining another example of a method for manufacturing a display device according to an embodiment of the present invention.

In particular, when it is difficult to ensure adequately large laser width (major axis width) relative to the width of two adjacent unit regions 26, in contrast to the above description, it is preferable that in the arrangement shapes in the adjacent two unit regions 26a and 26b, thin film transistors, in which channels are required to be crystallized, are collectively arranged in the adjacent portions 25 adjacent to the first virtual plane 23, as shown in FIG. 4. In this manner, every two pixels in ultimately produced display device 21 are crystallized by one operation and, thereby, the tact time may be reduced by almost a half. In this case, even when the energy distribution in the width direction orthogonal to the scanning direction is not always constant, if the distribution is bilaterally symmetric, the element characteristics of the two regions 26a and 26b are kept constant. Therefore, the flexibility in usable lasers is increased.

A method for manufacturing a thin film transistor 1 constituting each unit pixel of an ultimately produced display device will be described below with reference to FIG. 5. In the present embodiment, an example in which the thin film transistor 1 is formed simply in a scan line portion connected to a switching transistor and required to have low resistance will be described, although the present invention is not limited thereto.

Figure 5A:
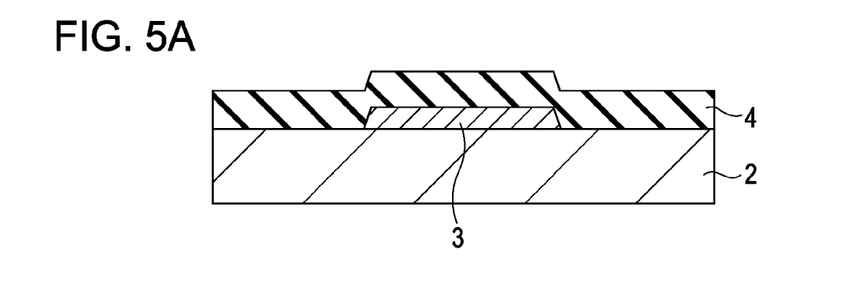

As shown in FIG. 5A, a substrate 2 having the insulating property is prepared. A molybdenum thin film is formed on the surface thereof by, for example, sputtering, and a gate electrode 3 is formed thereon by, for example, photolithography and etching. Although not shown in the drawing, a low-resistance wiring is electrically connected to this gate electrode 3, and the laser irradiation described below is conducted in such a way as to avoid this low-resistance wiring.

Figure 5B:
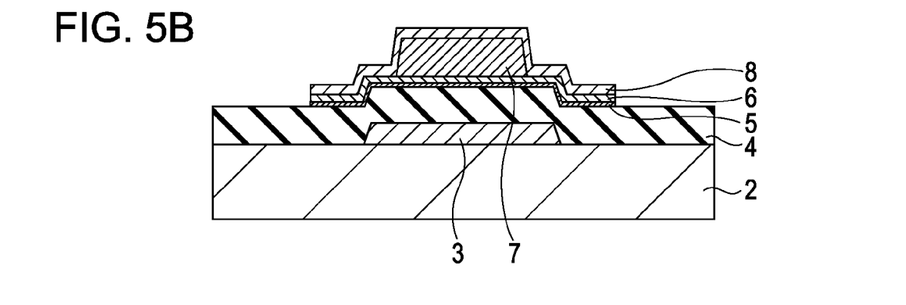

As shown in FIG. 5B, for example, a crystalline Si layer 5 is formed on this gate electrode 3 with a gate insulating layer 4 made of SiN and $SiO_2$ therebetween. The crystalline Si layer 5 is crystallized by conducting laser irradiation after amorphous Si is formed. For the crystallization method by using the laser, a laser may be directly applied at wavelengths suitable for being absorbed by amorphous silicon. Alternatively, a technique may be adopted, in which a photo-thermal conversion layer is formed thereon, laser irradiation is conducted at wavelengths suitable for being absorbed by the photo-thermal conversion layer so as to crystallize amorphous silicon by the heat generated from the photo-thermal conversion layer and, thereafter, the photo-thermal conversion layer is removed.

The laser irradiation is conducted by scan irradiation of laser light L having a major axis width, that is, a width in a direction orthogonal to a scanning direction, of a little less than 300 μm, which is slightly narrower than the size of the unit pixel, in a laser minor axis direction. At this time, it is preferable to avoid the above-described gate wiring 27 composed of a lamination structure of aluminum from being irradiated with a laser, in order that aluminum constituting the gate wiring is not damaged by the heat due to the laser irradiation.

Since the gate electrode 3 is composed of a material having a thermal conductivity higher than those of the Si layer 5 and the gate insulating layer 4, when the laser light L is moved with the scanning irradiation and comes near the arrangement portion of the gate electrode 3, the heat due to the irradiation begins to diffuse from the Si layer to the gate electrode 3, and the heat, which contributes to crystallization, may become nonuniform in the Si layer 5. Therefore, particularly in the case where an improvement of the uniformity in the crystallization is required, for example, a wider gate electrode 3 is disposed and, thereby, a heat transfer component having thermal conductivity higher than that of the gate insulating layer is disposed on the side upstream to the ultimately produced channel region with respect to the laser light scanning. Consequently, the gate electrode 3 may be thermally saturated and become in a preannealed state before the laser light L reaches a portion corresponding to the channel region, and the uniformity of the crystallinity of the channel region may be improved.

An amorphous Si layer 6 is formed following the laser light L scanning irradiation. Subsequently, an etching stop layer 7 is made of, for example, SiN, in the portion ultimately corresponding to the channel region on the resulting amorphous Si layer 6. In the Si layer 5 and the amorphous Si layer 6, a channel region 15 is formed immediately below the etching stop layer 7, and a source region 12 and a drain region 13 are formed on two sides thereof.

Thereafter, an n+amorphous Si layer 8 is formed over the resulting etching stop layer 7 and an exposed portion of the peripheral amorphous Si layer 6.

Figure 5C:
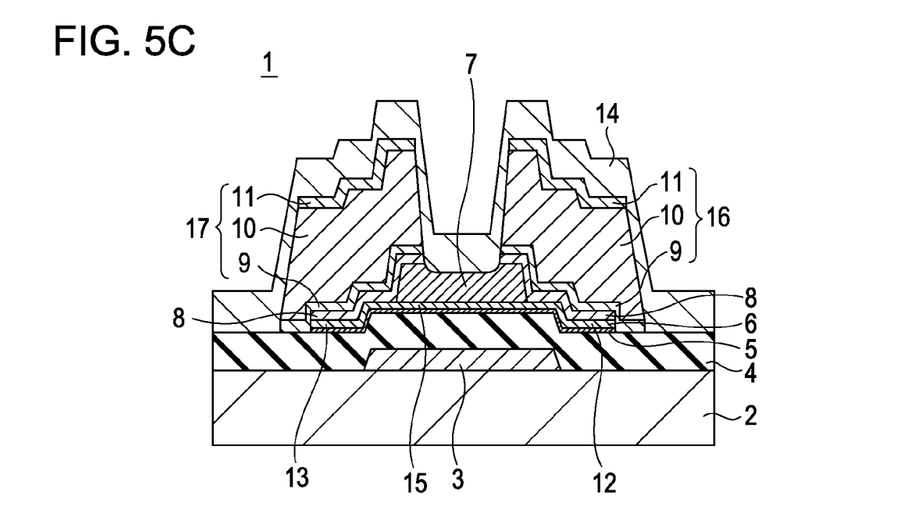

As shown in FIG. 5C, first to third metal layers 9 to 11 are formed over the n+amorphous Si layer 8 and the etching stop layer 7, and the first to third metal layers 9 to 11 on the etching stop layer 7 and the n+amorphous Si layer 8 of the channel portion are etched. In this manner, a source electrode 16 and a drain electrode 17 are made of the first to third metal layers 9 to 11 on the source region 12 and the drain region 13. Furthermore, a SiN layer 14 serving as a passivation film is formed all over the surface, so that a bottom gate type transistor based on the inverted staggered type configuration is produced, for example.

Preferably, low-resistance wirings, e.g., the gate wiring 27, are formed simultaneously with the formation of this thin film transistor 1.

Figure 6A:
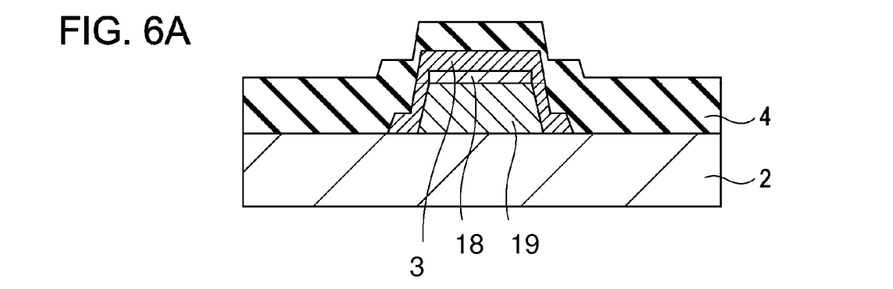
Figure 6B:
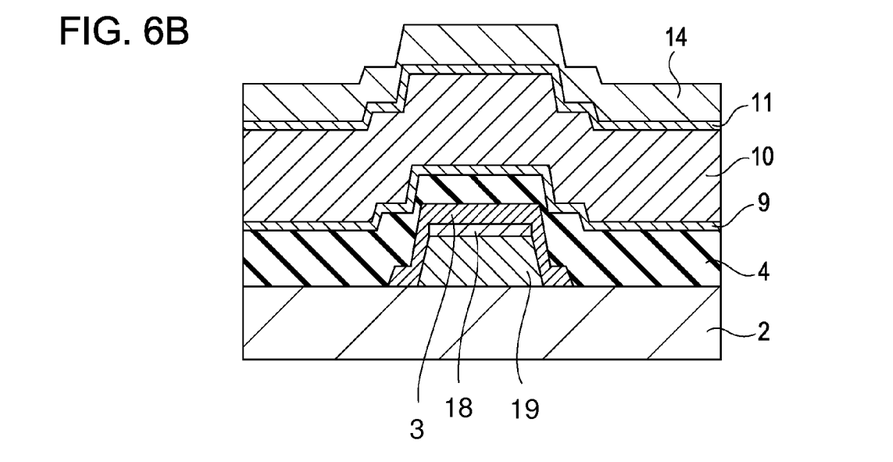

Specifically, as shown in FIG. 6A, low-resistance electrically conductive films composed of a Mo layer 18 made of molybdenum and an Al layer 19 made of aluminum are formed by lamination in advance at the position where the gate wiring 27 is formed ultimately, and the gate electrode 3 made of the Mo thin film, which is common to the formation of the above-described thin film transistor 1, and the gate insulating layer 4 are formed into predetermined shapes thereon. As shown in FIG. 6B, on the thus formed gate wiring 27, a first metal layer 9, a second metal layer 10, a third metal layer 11, and a SiN layer 14 are formed by lamination.

Figure 6C:
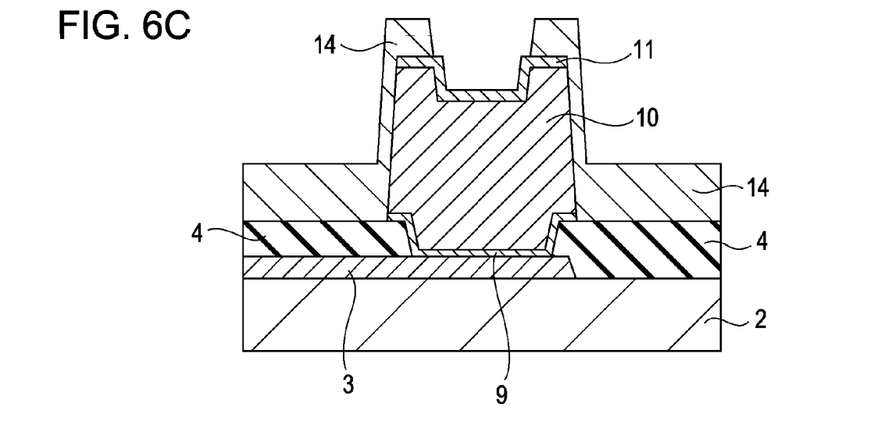

The low-resistance electrically conductive films, that is, the Mo layer 18 and the Al layer 19, electrically connected to the gate electrode 3 may be formed to the end of the gate wiring 27. However, an example, in which these layers are terminated while not reaching the end portion and the wiring up to the end portion is formed by the gate electrode 3 alone, is shown in FIG. 6C. The gate electrode 3 is connected to the first metal layer 9, the second metal layer 10, and the third metal layer 11, independent of one another, through a contact hole disposed in the gate insulating layer 4 in advance. Consequently, a power source (not shown in the drawing) and the gate wiring 27 are allowed to become electrically continuous.

As described above, it becomes possible to appropriately crystallize the thin film transistor 1 while a reduction in the yield of the wiring is suppressed by conducting laser irradiation in such a way as to avoid the gate wiring 27 including the low-resistance electrically conductive, that is, the low-resistance electrically conductive films composed of the Mo layer 18 and the Al layer 19 in the present embodiment.

Up to this point, the display device and the method for manufacturing the display device according to the embodiments of the present invention have been described. However, the materials to be used, the amount thereof, and the numerical conditions of the treatment time, the size, and the like included in the above-described embodiments are no more than preferable exemplifications. The sizes, shapes, and arrangement relationships in each drawing used for the explanations are also exemplifications. That is, the present invention is not limited to the above-described embodiments.

For example, titanium, tungsten, tantalum, chromium, vanadium, nickel, and alloys thereof may be used in place of the above-described molybdenum.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed is:

1. An organic electroluminescence display device comprising a plurality of unit pixels disposed in a matrix on a substrate,
    wherein each of the unit pixels has a thin film transistor including a channel region, the thin film transistor formed at a position other than a center of the unit pixel, the unit pixel including an irradiated area that has been irradiated with laser light while the thin film transistor is formed to crystallize at least said channel region,
    wherein unit pixels in a first row and unit pixels in a second row adjacent to the first row are arranged symmetrically with respect to a first virtual plane orthogonal to a main surface of the substrate,
    wherein each of the unit pixels further comprises a gate wiring made of a first material whose thermal resistance is lower than the thermal resistance of a gate electrode of the thin film transistor,
    wherein each of the gate wiring includes a first portion extending in a row direction of the unit pixels and a second portion extending from the first portion towards the respective thin film transistors,
    wherein the second portion of the gate wiring made of the first material is electrically connected to the gate electrode made of at least a second material different than the first material,
    wherein each of said gate wiring is arranged at a position further away from the first virtual plane than the thin film transistor, and
    wherein the irradiated area of the unit pixel includes an area encompassing the thin film transistor, but excludes an area encompassing the first portion of the gate wiring and at least a part of the second portion of the gate wiring.

2. The organic electroluminescence display device according to claim 1, wherein for each of the thin film transistor, the gate electrode is formed on an insulating substrate.

3. The organic electroluminescence display device according to claim 2, wherein for each of the unit pixel, the gate wiring is electrically connected to the gate electrode.

4. The organic electroluminescence display device according to claim 3, wherein for each of the thin film transistor, a gate insulating layer is formed on the gate electrode, and a Si layer is provided on the gate insulating layer, wherein a portion of the thin film transistors that are crystallized includes the Si layer.

5. The organic electroluminescence display device according to claim 4, wherein the gate electrode is composed of a material having a thermal conductivity higher than that of both the Si layer and the gate insulating layer.

6. The organic electroluminescence display device according to claim 5, wherein during the laser irradiation of the unit pixels, for each of the unit pixel, the gate electrode becomes thermally saturated to become in a pre-annealed state before the laser reaches the channel region of the respective thin film transistor.

7. The organic electroluminescence display device according to claim 4, wherein an amorphous Si layer is formed on the Si layer after the Si layer has been crystallized, an etching stop layer is formed on a portion of the amorphous Si layer, and an n+amorphous Si layer is formed on the etching stop layer and portions of the amorphous Si layer.

8. The organic electroluminescence display device according to claim 7, wherein first, second, and third metal layers are formed over the n+amorphous Si layer to form a source electrode and a drain electrode of the thin film transistor.

* * * * *